(12) United States Patent
Hsia et al.

(10) Patent No.: US 9,082,786 B2
(45) Date of Patent: *Jul. 14, 2015

(54) METHOD OF FABRICATING A SELF-ALIGNING DAMASCENE MEMORY STRUCTURE

(71) Applicant: SanDisk 3D LLC, Milpitas, CA (US)

(72) Inventors: Kang-Jay Hsia, Pleasanton, CA (US); Calvin K. Li, Fremont, CA (US); Christopher John Petti, Mountain View, CA (US)

(73) Assignee: SANDISK 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/140,468

(22) Filed: Dec. 24, 2013

(65) Prior Publication Data

US 2014/0117514 A1 May 1, 2014

Related U.S. Application Data

(63) Continuation of application No. 13/781,983, filed on Mar. 1, 2013, now Pat. No. 8,633,105, which is a continuation of application No. 12/611,087, filed on Nov. 2, 2009, now Pat. No. 8,389,399, which is a continuation of application No. 11/786,620, filed on Apr. 12, 2007, now Pat. No. 7,629,247.

(51) Int. Cl.
| | |
|---|---|
| *H01L 21/311* | (2006.01) |
| *H01L 29/66* | (2006.01) |
| *H01L 27/10* | (2006.01) |
| *H01L 27/102* | (2006.01) |
| *H01L 29/868* | (2006.01) |
| *H01L 21/768* | (2006.01) |

(52) U.S. Cl.
CPC .......... *H01L 29/6609* (2013.01); *H01L 27/101* (2013.01); *H01L 27/1021* (2013.01); *H01L 29/868* (2013.01); *H01L 21/76802* (2013.01)

(58) Field of Classification Search
USPC .................. 438/621, 270, 197, 680, 700; 257/E21.006, E21.051, E21.17, 257/E21.227, E21.229, E21.267, E21.304, 257/E21.315
See application file for complete search history.

(56) References Cited

U.S. PATENT DOCUMENTS

| | | |
|---|---|---|
| 5,441,907 A | 8/1995 | Sung et al. |
| 6,034,882 A | 3/2000 | Johnson et al. |

(Continued)

FOREIGN PATENT DOCUMENTS

| | | |
|---|---|---|
| EP | 1 403 920 | 3/2004 |
| KR | 10-2001-0008447 | 2/2001 |
| KR | 10-2005-0066963 | 6/2005 |

OTHER PUBLICATIONS

International Search Report and Written Opinion of International Application No. PCT/US2008/004665 mailed Jun. 25, 2008.

(Continued)

*Primary Examiner* — David Nhu
(74) *Attorney, Agent, or Firm* — Dugan & Dugan, PC (57) ABSTRACT

A method of forming a memory cell is provided. The method includes forming a first pillar-shaped element that includes a first semiconductor material, forming a first opening self-aligned with the first pillar-shaped element, and depositing a second semiconductor material in the first opening to form a second pillar-shaped element above the first pillar-shaped element. Other aspects are also provided.

20 Claims, 13 Drawing Sheets

(56) References Cited

U.S. PATENT DOCUMENTS

| | | | |
|---|---|---|---|
| 6,248,667 B1 | 6/2001 | Kim | |
| 6,420,215 B1 | 7/2002 | Knall et al. | |
| 6,525,953 B1 | 2/2003 | Johnson et al. | |
| 6,717,222 B2 | 4/2004 | Zhang | |
| 6,952,043 B2 | 10/2005 | Yvoda et al. | |
| 7,557,405 B2 | 7/2009 | Herner et al. | |
| 7,629,247 B2 * | 12/2009 | Hsia et al. | 438/621 |
| 8,389,399 B2 * | 3/2013 | Hsia et al. | 438/621 |
| 8,633,105 B2 * | 1/2014 | Hsia et al. | 438/621 |
| 8,816,394 B2 * | 8/2014 | Chau et al. | 257/192 |
| 2004/0245517 A1 | 12/2004 | Campbell | |
| 2006/0273298 A1 | 12/2006 | Petti | |
| 2006/0284237 A1 | 12/2006 | Park et al. | |
| 2008/0017890 A1 | 1/2008 | Yuan et al. | |
| 2010/0044756 A1 | 2/2010 | Hsia et al. | |
| 2013/0175675 A1 | 7/2013 | Hsia et al. | |

OTHER PUBLICATIONS

Sep. 15, 2008 Office Action of U.S. Appl. No. 11/786,620.
Apr. 3, 2009 Notice of Allowance of U.S. Appl. No. 11/786,620.
Jul. 30, 2009 Notice of Allowance of U.S. Appl. No. 11/786,620.
Dec. 15, 2008 Reply to Sep. 15, 2008 Office Action of U.S. Appl. No. 11/786,620.
Feb. 24, 2009 Supplemental Amendment of U.S. Appl. No. 11/786,620.
Mar. 25, 2011 Chinese Office Action of related Chinese Application No. 200880019869.3.
Extended European Search Report in related European Application No. 08727325.6 mailed Jun. 24, 2011.
Aug. 9, 2011 Reply to Mar. 25, 2011 Chinese Office Action of related Chinese Application No. 200880019869.3.
Office Action of related U.S. Appl. No. 12/611,087 mailed Jul. 23, 2012.
Oct. 22, 2012 Response to Jul. 23, 2012 Office Action of related U.S. Appl. No. 12/611,087.
Notice of Allowance of related U.S. Appl. No. 12/611,087 mailed Nov. 19, 2012.
Office Action of related U.S. Appl. No. 13/781,983 mailed May 17, 2013.
Aug. 12, 2013 Response to May 17, 2013 Office Action of related U.S. Appl. No. 13/781,983.
Notice of Allowance of related U.S. Appl. No. 13/781,983 mailed Sep. 16, 2013.

* cited by examiner

METHOD OF FABRICATING A SELF-ALIGNING DAMASCENE MEMORY STRUCTURE

This application is a continuation of and claims priority from U.S. patent application Ser. No. 13/781,983 filed Mar. 1, 2013, and titled "METHOD OF FABRICATING A SELF-ALIGNING DAMASCENE MEMORY STRUCTURE", which is a continuation of and claims priority from U.S. patent application Ser. No. 12/611,087, filed Nov. 2, 2009, now U.S. Pat. No. 8,389,399, and titled "METHOD OF FABRICATING A SELF-ALIGNING DAMASCENE MEMORY STRUCTURE", which is a continuation of and claims priority from U.S. patent application Ser. No. 11/786,620, filed Apr. 12, 2007, now U.S. Pat. No. 7,629,247, and titled "METHOD OF FABRICATING A SELF-ALIGNING DAMASCENE MEMORY STRUCTURE". All of the above applications are hereby incorporated by reference herein in their entirety.

BACKGROUND OF THE INVENTION

The field of the invention relates to memory devices and more particularly to non-volatile semiconductor memories.

Continuing to increase rapidly is the use of computer memory, in particular non-volatile semiconductor memory, which retains its stored information even when power is removed. A wide variety of non-volatile memories exist. A typical commercial form of non-volatile memory utilizes one or more arrays of transistor cells, each cell capable of non-volatile storage of one or more bits of data.

Non-volatile memory is unlike volatile random access memory ("RAM"), which is also solid-state memory, but does not retain its stored data after power is removed. The ability to retain data without a constant source of power makes non-volatile memory well adapted for consumer devices. Such memories are well adapted to small, portable devices because they are typically relatively small, have low power consumption, operate quickly, and are relatively immune to the operating environment.

In general, the small size, low power consumption, high speed and immunity to environment are derived from the structure of the memory. In this regard, such non-volatile memory devices are typically fabricated on silicon substrates. In addition, to obtain the advantages of small size, etc., and well as reduce costs, there is a continual effort to fabricate more circuitry within a given area.

Highly effective approaches to increase density of non-volatile memory include monolithic three dimensional memories disclosed in Johnson et al. U.S. Pat. No. 6,034,882, Johnson et al. U.S. Pat. No. 6,525,953, Knall et al. U.S. Pat. No. 6,420,215, and Vyvoda et al. U.S. Pat. No. 6,952,043, all hereby incorporated by reference in the entirety for all purposes.

The fabrication of these high-density, three dimensional memory arrays presents a number of challenges. For instance, misalignment of features during fabrication results in reduced yield and becomes more problematic as feature size is reduced. For example, in the event that a photomask is improperly placed, a memory element may be short circuited during subsequent fabrication operations. Thus, alternate methods of fabrication are needed that reduce the difficulties of aligning memory elements during fabrication while permitting improved density, decreased future size, and improved yield.

SUMMARY OF THE INVENTION

In an aspect of the invention, a method of forming a memory cell is provided. The method includes forming a first pillar-shaped element that includes a first semiconductor material, forming a first opening self-aligned with the first pillar-shaped element, and depositing a second semiconductor material in the first opening to form a second pillar-shaped element above the first pillar-shaped element.

Other features and aspects of the present invention will become more fully apparent from the following detailed description, the appended claims and the accompanying drawings.

BRIEF DESCRIPTION OF DRAWINGS

The features of the present invention, which are believed to be novel, are set forth with particularity in the appended claims. The invention, together with further advantages, may best be understood by reference to the following description taken in conjunction with the accompanying drawings. In the figures, like reference numerals identify like elements.

DETAILED DESCRIPTION

Although the present invention is susceptible of embodiments in various forms, there is shown in the drawings, and will hereinafter be described, some exemplary and non-limiting embodiments, with the understanding that the present disclosure is to be considered an exemplification of the invention and is not intended to limit the invention to the specific embodiments illustrated. In this disclosure, the use of the disjunctive is intended to include the conjunctive. The use of the definite article or indefinite article is not intended to indicate cardinality. In particular, a reference to "the" object or "an" object is intended to denote also one or a possible plurality of such objects.

Figure 1:
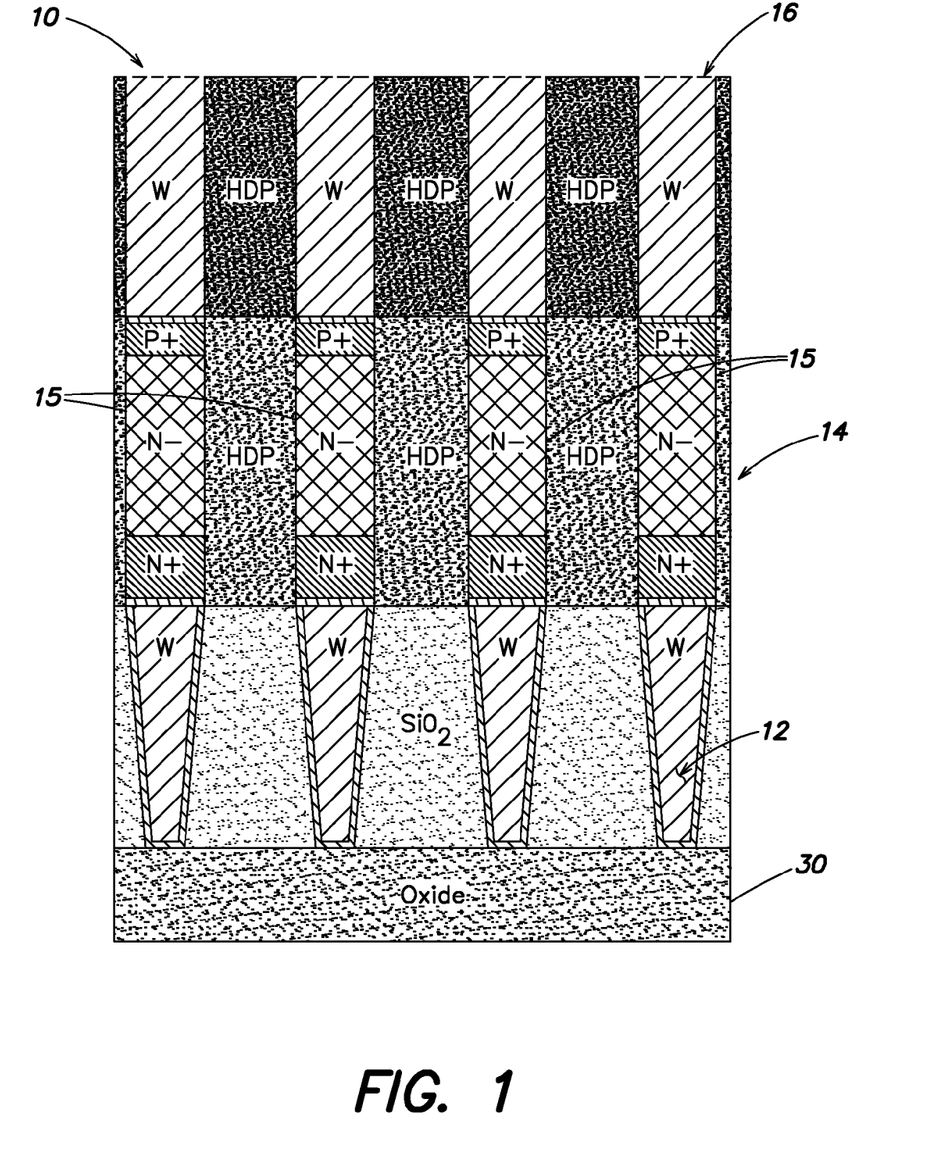
FIG. 1 is a cross-sectional view illustrating one embodiment of a monolithic three dimensional memory array.

FIG. 1 depicts one embodiment of a monolithic three dimensional memory array 10 which includes a first set of conductors 12, an array of memory cells 14 composed of individual memory elements or cells 15 and a second set of conductors 16. Array 10 is fabricated above the surface of a substrate. It should be noted that, for simplicity, first set of conductors 12 and second set of conductors 16 are shown as being parallel.

However, in actual construction, first set of conductors 12 and second set of conductors 16 would be perpendicular, as shown generally in Herner et al. U.S. Pat. No. 7,557,405 (incorporated herein by reference). In some embodiments, supporting circuitry may also be created in wafer 18 before creation of the monolithic three dimensional memory array 10 on the substrate 18.

The process may begin with a set of steps that result in the creation of a set of CMOS transistors and other drive and selection circuitries, referred to as "the front end." The final step involves the creation of a routing layer. The routing layer may, for example, be formed by connecting the CMOS transistors below to the memory cells above.

Figure 2:
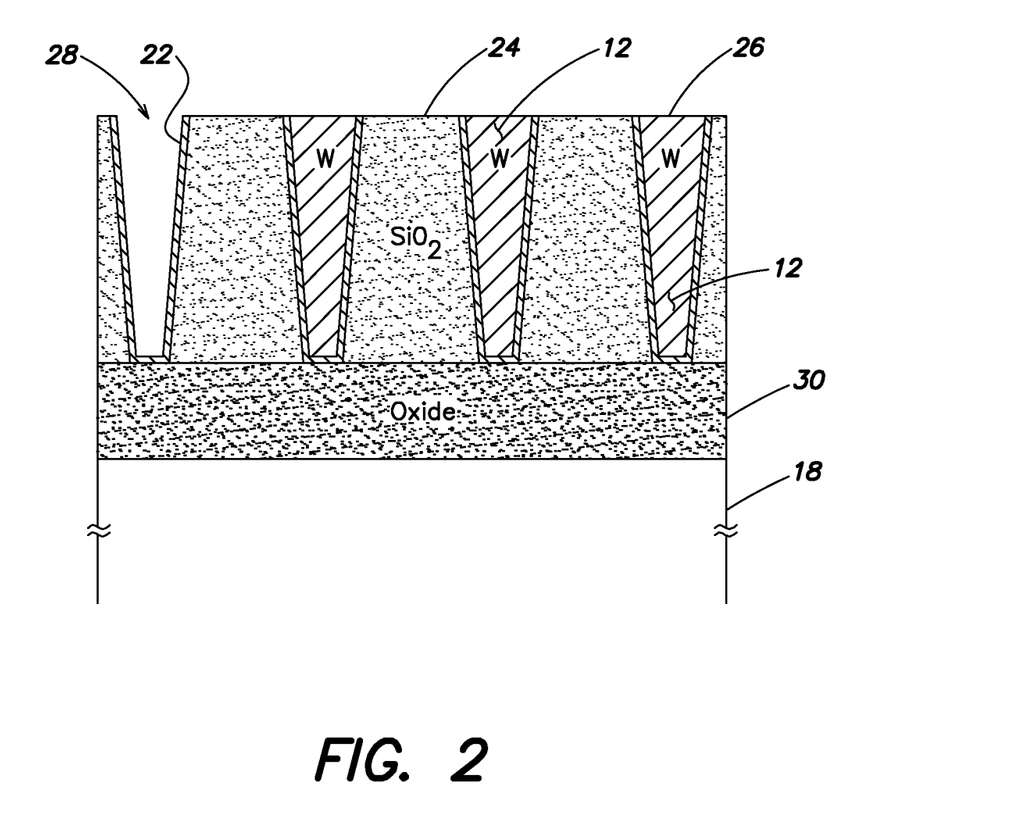
FIG. 2 is cross-sectional view illustrating one embodiment of fabrication a set of conductors for the three dimensional memory array.

In one embodiment, fabrication of memory array 10 may begin, as illustrated in FIG. 2, with formation of an insulating layer 30 over substrate 18. The thickness of insulating layer 30 may vary over a wide range; however, in one embodiment it may be about 2000 angstroms. Insulating layer 30 can be silicon dioxide, silicon nitride, a high-dielectric film, a Si—C—O—H film or any other suitable insulating material.

A first set of damascene conductive elements 12 may then be fabricated over insulating layer 30. As used herein, a damascene conductor or conductive element 12 is a conductor formed by a damascene process. A damascene process for forming conductive lines is a process in which, for example, a material such as a dielectric 24 (e.g., as shown in the illustrated embodiment of FIG. 2, an oxide such as silicon dioxide) is deposited over insulating layer 30 of substrate 18, after which lines or slots 28 are etched in dielectric 24, and then the slots or lines are filled with a conductive material 26 to create the conductors 12. The conductive material film on top of the original plane of dielectric 24 is removed by any suitable process, (e.g., chemical-mechanical planarization ("CMP")), leaving isolated conductive material 26 as conductive elements 12 (i.e., conductors or wires), with the remaining dielectric material 24 insulating conductors 12 from one another.

To form the conductive elements 12 illustrated in the embodiment of FIG. 2, dielectric layer 24 may be blanket deposited over the insulating layer 30. Dielectric layer 24 may be any suitable electrically insulating material (e.g., silicon dioxide, silicon nitride, silicon oxynitride, etc.). In one embodiment, dielectric layer 24 may be silicon dioxide, as shown, deposited by an appropriate method (e.g., chemical vapor deposition ("CVD"), high density plasma ("HDP"), etc.).

Dielectric layer 24 may then be patterned and etched to form slots 28 for conductors 12. For example, dielectric layer 24 may be covered with a photoresist and exposed. The exposed (or unexposed) photoresist may be removed, and dielectric layer 24 in the exposed (or unexposed) areas etched away to define the slots or lines 28.

A conductive material 26 may then be deposited in slots 28. To help conductive material 26 adhere to oxide layer 24, an optional adhesion layer 22 may first be deposited in slots 28. Adhesion layer 22, in some embodiments, may be TaN, WN, TiW, sputtered tungsten, TiN or combinations of these materials. If conductive material 26 of the damascene conductive elements 12 is tungsten, TiN is preferred as adhesion layer 22. In the case where an adhesion layer 22 is included, it can be deposited by any process known in the art.

Where the adhesion layer is TiN, a layer of TiN may be deposited or a layer of Ti may be deposited and followed by a nitridation process. In some other embodiments, an adhesion layer of TiN may be deposited by a CVD process, physical vapor deposition ("PVD") process such as sputtering, or an atomic layer deposition ("ALD") process. In one embodiment, TiN layer 22 may be deposited by sputtering to a depth of from 20 to about 500 angstroms.

Conductive material 26 may then be deposited over adhesion layer 22 as illustrated in FIG. 2. Conductive material 26 may be formed from any of a number of conductive metals (e.g., tantalum, titanium, tungsten, aluminum, copper, cobalt, alloys thereof, etc.). Where conductive material 26 is tungsten, it may, for example, be deposited by any suitable process, such as a CVD process or a PVD process.

In one embodiment, the tungsten is deposited by a CVD process. The depth of conductive element 12 can depend upon the desired resistance limits of conductive elements 12. In one embodiment, the depth may be in a range from about 200 to about 4000 angstroms and in another embodiment the thickness may be approximately 3000 angstroms. As used herein, thickness means vertical thickness measured in a direction perpendicular to the substrate. Width means the width of a line or feature in a plane parallel to the substrate.

Deposition of adhesion layer 22 and conducting materials 26 within slots 28 also results in an overcoating of the adhesion and conducting materials over oxide 24 that separate the conductive elements 12. To remove the overcoat, the overcoated conducting material 26 and adhesion layer 22 over oxide 24 may be planarized. This planarization may be performed using any suitable planarizing process such as CMP.

Figure 3A:
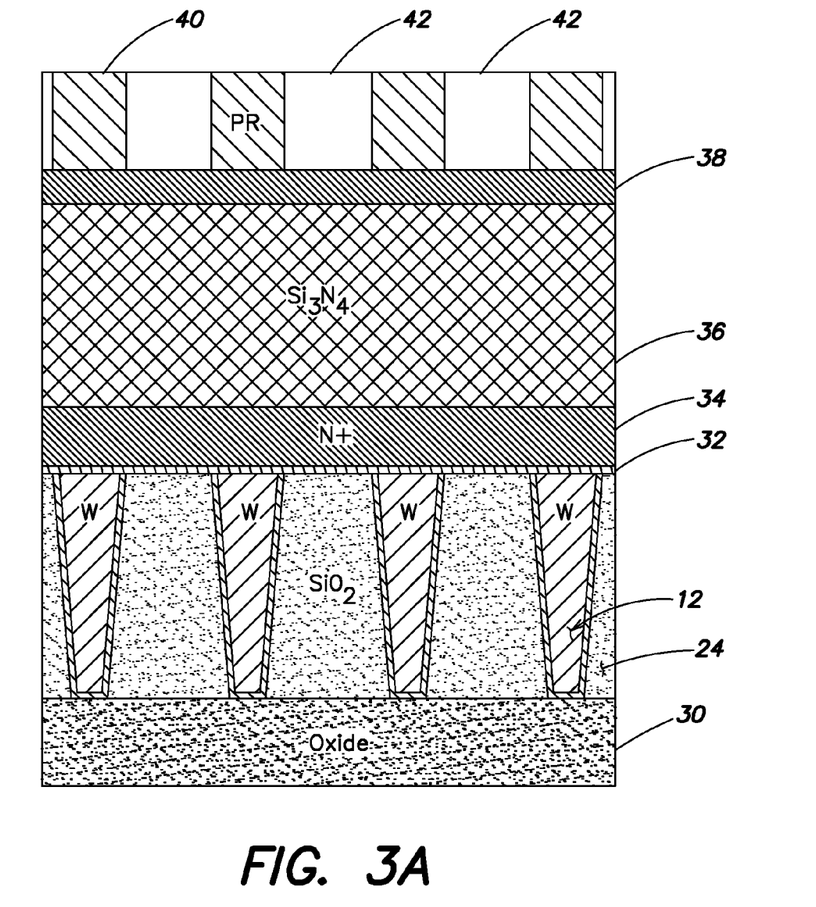
FIG. 3A is a cross-sectional view illustrating one embodiment of formation of a dielectric layer for fabrication of a memory array.

Individual memory cells 15 of the array of memory cells 14 of FIG. 1 may then be formed over the first set of conductors 12. Memory cells 15 in some embodiments may each include two portions of a diode, and an anti-fuse with an optional barrier layer. As illustrated in FIG. 3A, in one embodiment, a barrier layer 32 may be deposited over the planarized surface of dielectric 24 and conductors 12. Barrier layer 32 functions to prevent unwanted interaction between conductive material 26 forming conductors 12 and semiconductor layers deposited over conductors 12.

Barrier layer 32 may be deposited as a blanket layer over conductors 12 and dielectric 24. Barrier layer 32 may be any suitable barrier material such as WN, TaN, TiN, etc., and may be deposited in any of the manners discussed above with reference to adhesion layer 22. In embodiments where conductive elements 12 are tungsten, barrier layer 32 in one embodiment may be TiN. The thickness of the barrier layer may be any thickness that provides the barrier function. In one embodiment, the thickness may be about 20 to about 500 angstroms and in another embodiment, about 100 angstroms.

In the embodiment of FIG. 3A, a layer 34 of a heavily doped semiconductor of a first type (e.g., N-type or P-type silicon) is deposited as shown. Layer 34 may form an ohmic contact with barrier layer 32 to conductor 12 of FIG. 1. The heavily doped layer 34 may be formed using any suitable deposition and doping methods.

In one embodiment, the heavily doped semiconductor 34 may be N-type silicon as shown, and the thickness may range from about 100 to over 2000 angstroms and preferably about 500 angsroms. Layer 34 may have a doping concentration of from about $1\times10^{19}$ to about $1\times10^{21}$ atoms/cm$^3$, and in one embodiment about $5\times10^{20}$ atoms/cm$^3$.

Over heavily doped layer 34, a layer 36 of a sacrificial material such as a dielectric material (e.g., $Si_3N_4$) may be deposited in one embodiment via any known method. The sacrificial material may be any suitable material such as silicon oxide, silicon nitride, silicon oxynitrate, etc. As illustrated, in one embodiment, the sacrificial dielectric may be $Si_3N_4$ deposited to a thickness of about 3000 angstroms.

The thickness of sacrificial layer 36 is chosen based upon the desired thickness of the pillar structure to be fabricated. Prior to deposition of sacrificial material layer 36, a thin silicon oxide layer (e.g., 12-20 angstroms) may be allowed to form over the semiconductor layer 34. This native oxide layer provides beneficial protection of semiconductor layer 34.

Once sacrificial layer 36 has been deposited, the wafer may be patterned and etched. To this end, in one embodiment a hard mask 38 (e.g., dark antireflective coating ("DARC"), bottom antireflective coating ("BARC"), or oxide layer) and a photoresist material 40 may be deposited over the sacrificial layer 36. In one embodiment hard mask 38 may be about 320 angstroms thick and photoresist material 40 may be about 1600 angstroms thick.

Figure 3B:
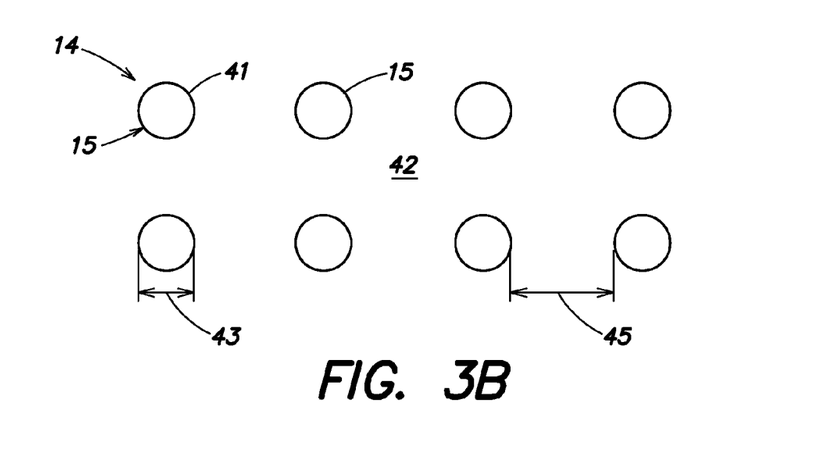
FIG. 3B is a diagram illustrating a top view of one embodiment of an array of pillar structures for the memory array.

Photoresist material 40 may be exposed through a photomask (not shown) to define a periphery 41 (see FIG. 3B) of memory cells 15. FIG. 3B illustrates an example of an array 14 of pillar-shaped memory cells 15 viewed from above. The memory cells may, in one embodiment, be arranged in a two-dimensional array of rows and columns as illustrated in the example of FIG. 3B. In exemplary embodiments, the diameter 43 of each memory cell 15 may be 45 nm-130 nm, and memory elements 15 may be separated by a distance 45 of 45 nm-130 nm. These dimensions may vary over a wide range and are limited by the lithography technology used.

Figure 4:
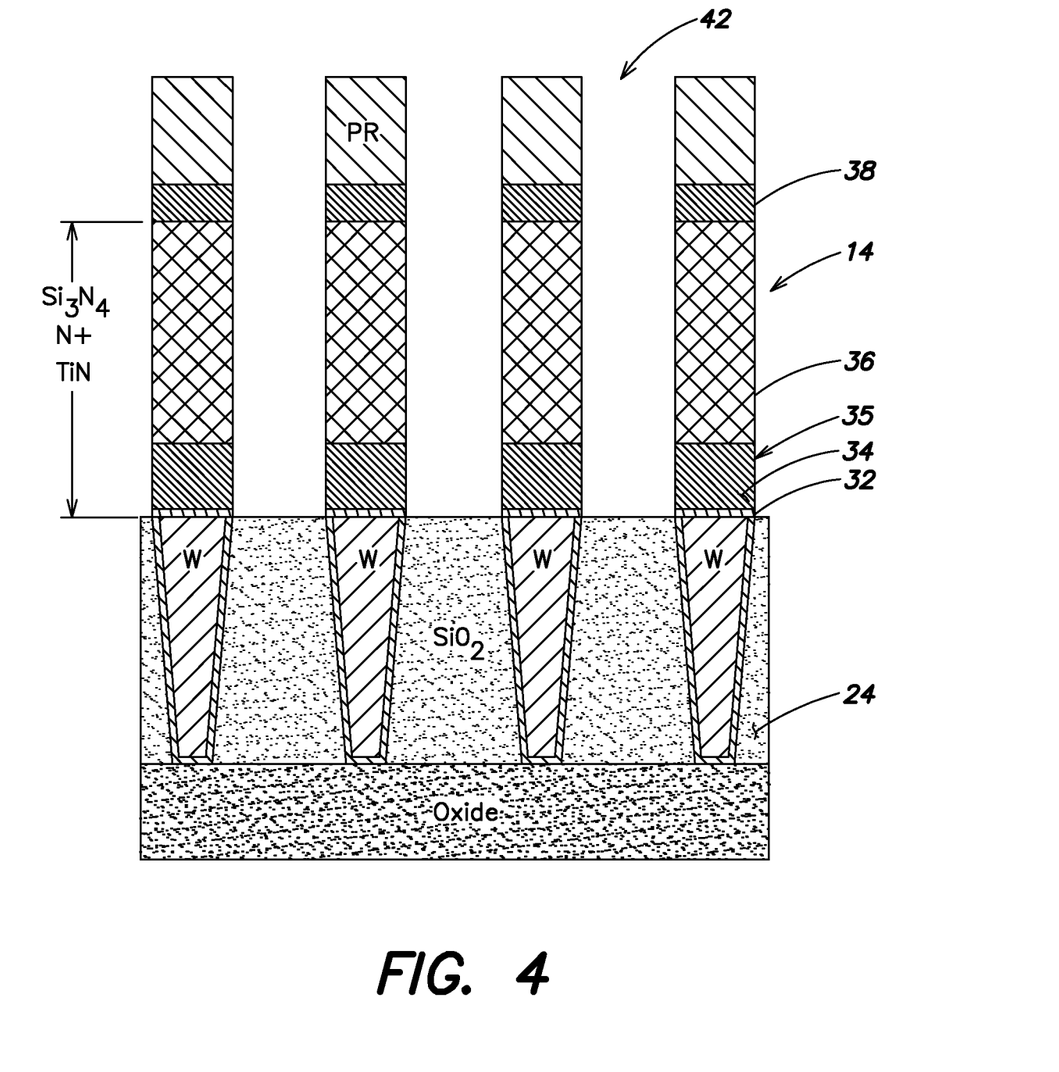
FIG. 4 is a cross-sectional view illustrating one embodiment of fabrication of dielectric pillars for fabrication of the memory array.

Following exposure of photoresist 40, the area 42 outside periphery 41 of each memory cell is removed via an appropriate process (e.g., a dry etch process). As shown in FIG. 4, area 42 outside the periphery of the memory cells 14 is etched through hard mask 38, sacrificial layer 36, the layer of the semiconductor of the first type 34 and barrier layer 32 to expose insulator layer 24 at the bottom of etch area 42. Following the etch step, the remaining photoresist 40 may be removed. A HF clean step may be used to remove any remaining photoresist and clean the surface of the oxide. This step results in an array of pillar-shaped elements made up of pillar-shaped semiconductor elements 35 capped by a pillar of sacrificial material 36.

Figure 5:
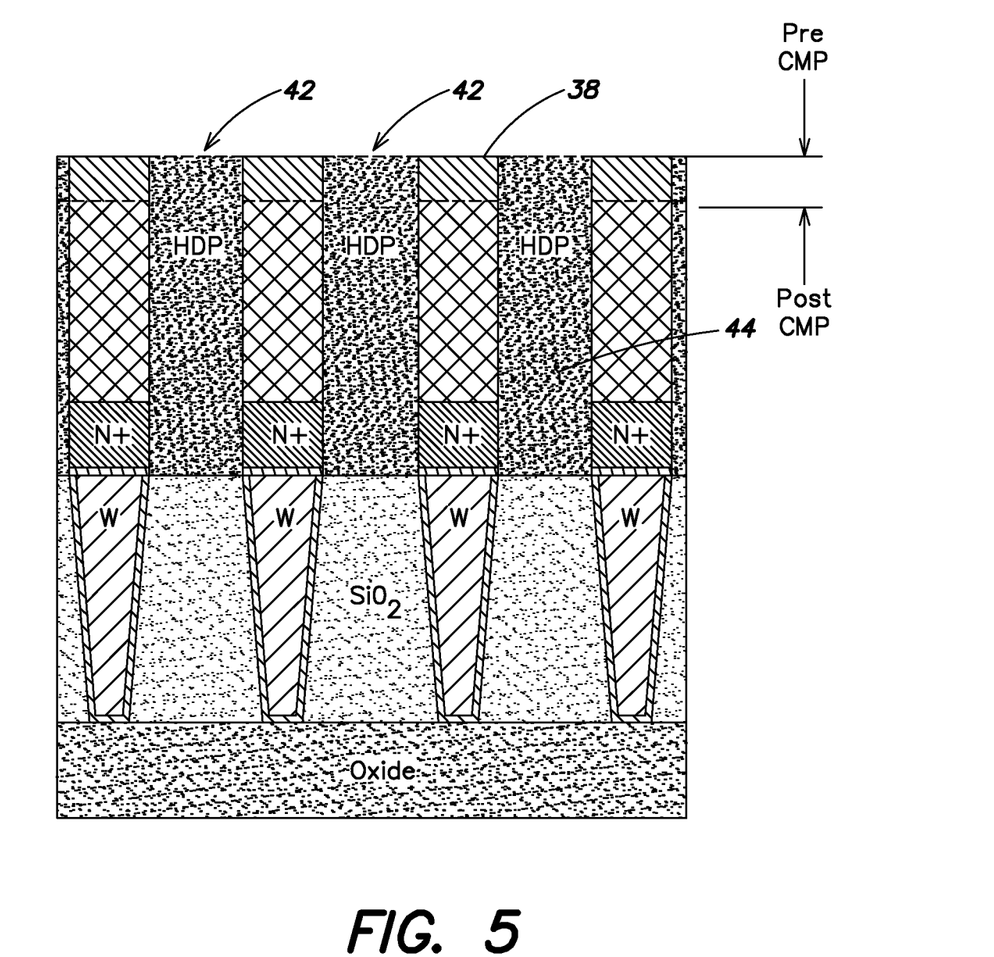
FIG. 5 is a cross-sectional view illustrating one embodiment of formation of a mold for fabrication of the memory array.

As illustrated in the embodiment of FIG. 5, following removal of the photoresist, etched area 42 may be filled using any suitable insulating material 44 (e.g., silicon oxide, silicon oxynitride, etc.). Where the insulating material is silicon oxide, the silicon oxide may be deposited by an appropriate deposition process (e.g., CVD, high density plasma CVD ("HDPCVD"), etc.). In some embodiments, insulating material 44 may be a High Density Plasma Silicon Dioxide (HDP as shown in FIG. 5). Following the filling of the etched area, the surface may be planarized. Any appropriate technique (e.g., CMP) may be used to planarize the surface and to remove any remaining DARC. In the planarizing step, the hard mark 38 may be removed along with small portion of the sacrificial material 36 and oxide 44, as shown, to provide a planar surface.

Figure 6:
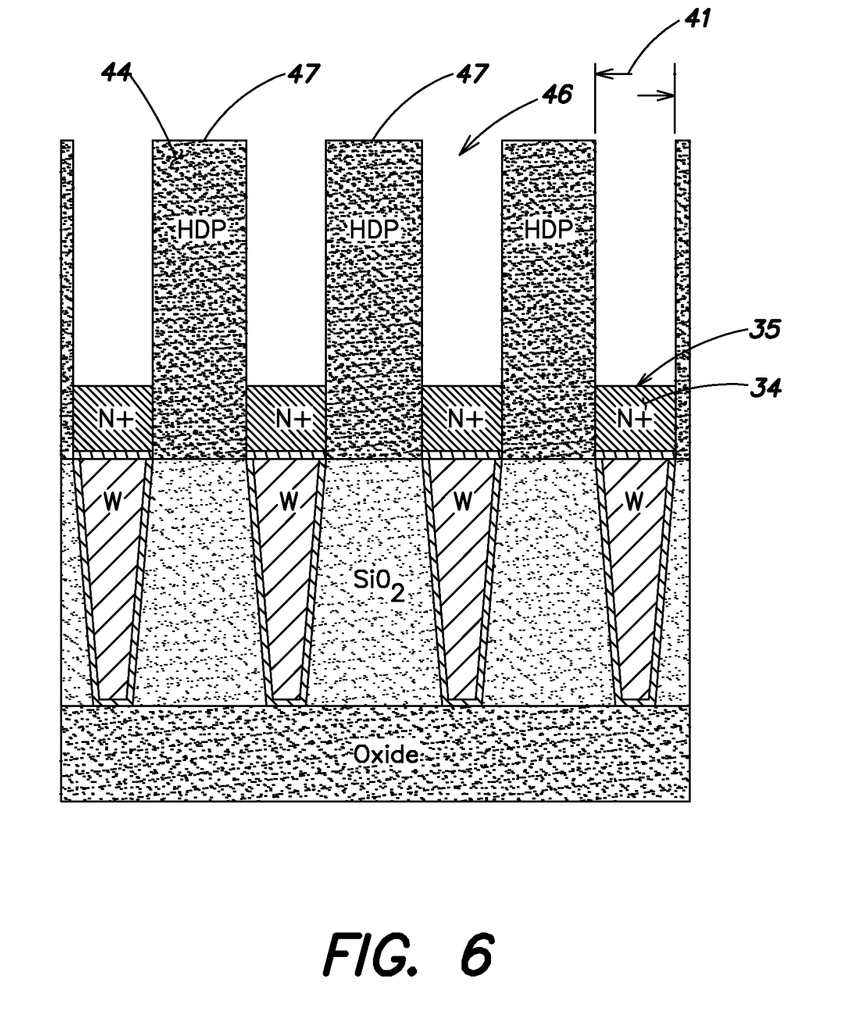
FIG. 6 is a cross-sectional view illustrating one embodiment of removal of dielectric pillars for formation of a dielectric mold.

Next, sacrificial material 36 lying within periphery 41 of each of memory cells 15 is removed down to the surface of the heavily doped layer 34 of the semiconductor of the first type as illustrated by the example of FIG. 6. Etching may be accomplished by any etch process (e.g., a wet etch) compatible with the sacrificial material (e.g., $Si_3N_4$), and which has good selectivity between the sacrificial material and insulating material 44 (e.g., HDP) and also heavily doped silicon 34.

Removal of sacrificial material 36 within periphery 41 of memory cells 15 forms a mold 47 made up of insulating material 44 as shown in the illustrated embodiment of FIG. 6. Open areas 46 within periphery 41 of mold 47 are self-aligned with the heavily doped semiconductor pillar structures 35 because the heavily doped semiconductor layer 34 and sacrificial layer 36 are patterned in a shared masking and etching step. This self alignment eliminates the spatial error that occurs when one layer is independently aligned to the layer below, and thereby allows smaller feature size and higher yield.

Figure 7:
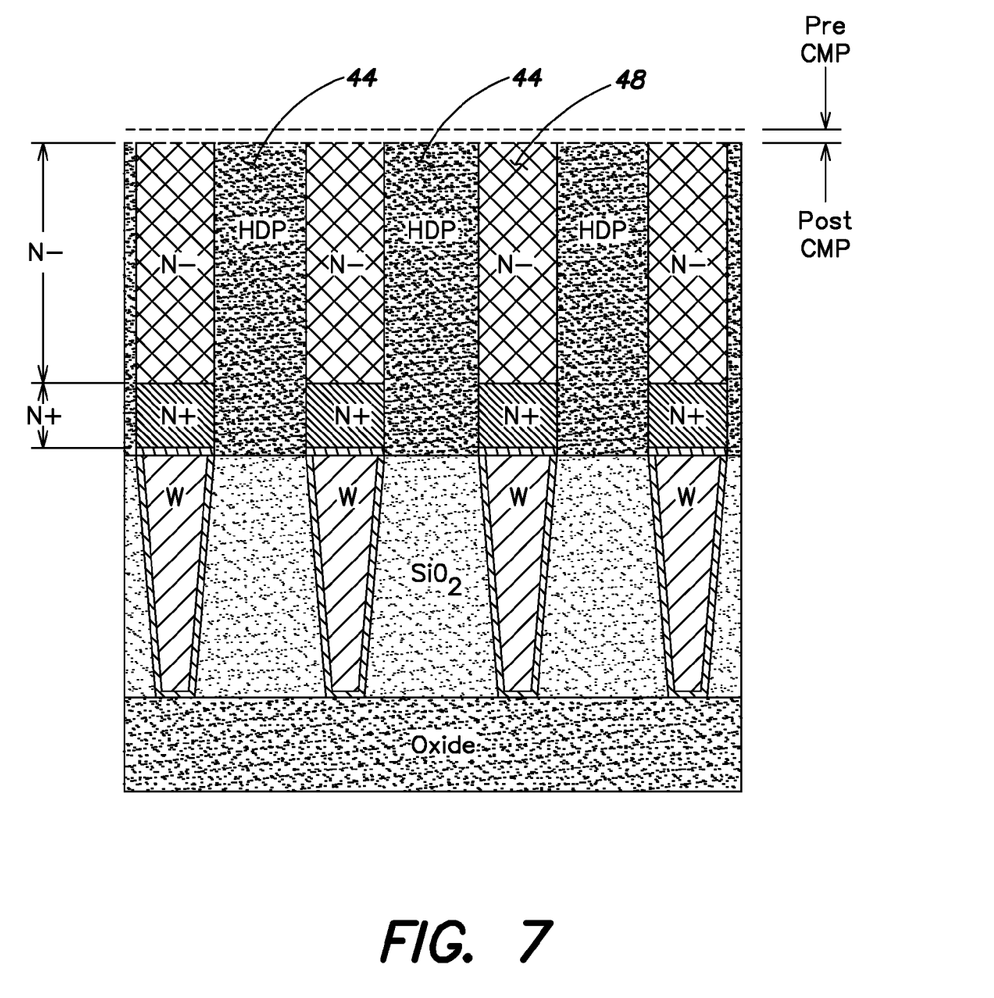
FIG. 7 is a cross-sectional view illustrating one embodiment of formation of a lightly doped pillar structure for the memory array.

The area 46 within periphery 41 (i.e., within mold 47) may next be backfilled with a semiconductor material 48 as illustrated in FIG. 7. An HF dip (e.g., 100:1 HF for 30 secs.) may be performed prior to the fill to remove any native oxide over semiconductor 34 and the clean surface for the fill. In one embodiment where heavily doped semiconductor 34 of the first type may be N+ silicon, then the semiconductor 48 is may, for example, be lightly doped N-silicon, as shown.

The backfill semiconductor material 48 can be deposited by any suitable deposition and doping method and may be deposited as poly-crystalline silicon. In the illustrated embodiment, the thickness of semiconductor material 48 can range from about 500 to 5000 angstroms, but in one embodiment a thickness of about 2500 angstroms may be used. In one embodiment, layer 48 can have a doping concentration from about $1\times10^{15}$ to about $1\times10^{18}$ atoms/cm$^3$.

In another embodiment, silicon is deposited without intentional doping since defects will render the silicon effectively slightly doped N-type. The surface of semiconductor material 48 may be planarized to remove excess semiconductor material and provide smooth, planar surface. Planarization may be performed by any suitable technique such as CMP, and may be followed by a HF dip to clean the surface.

Figure 8:
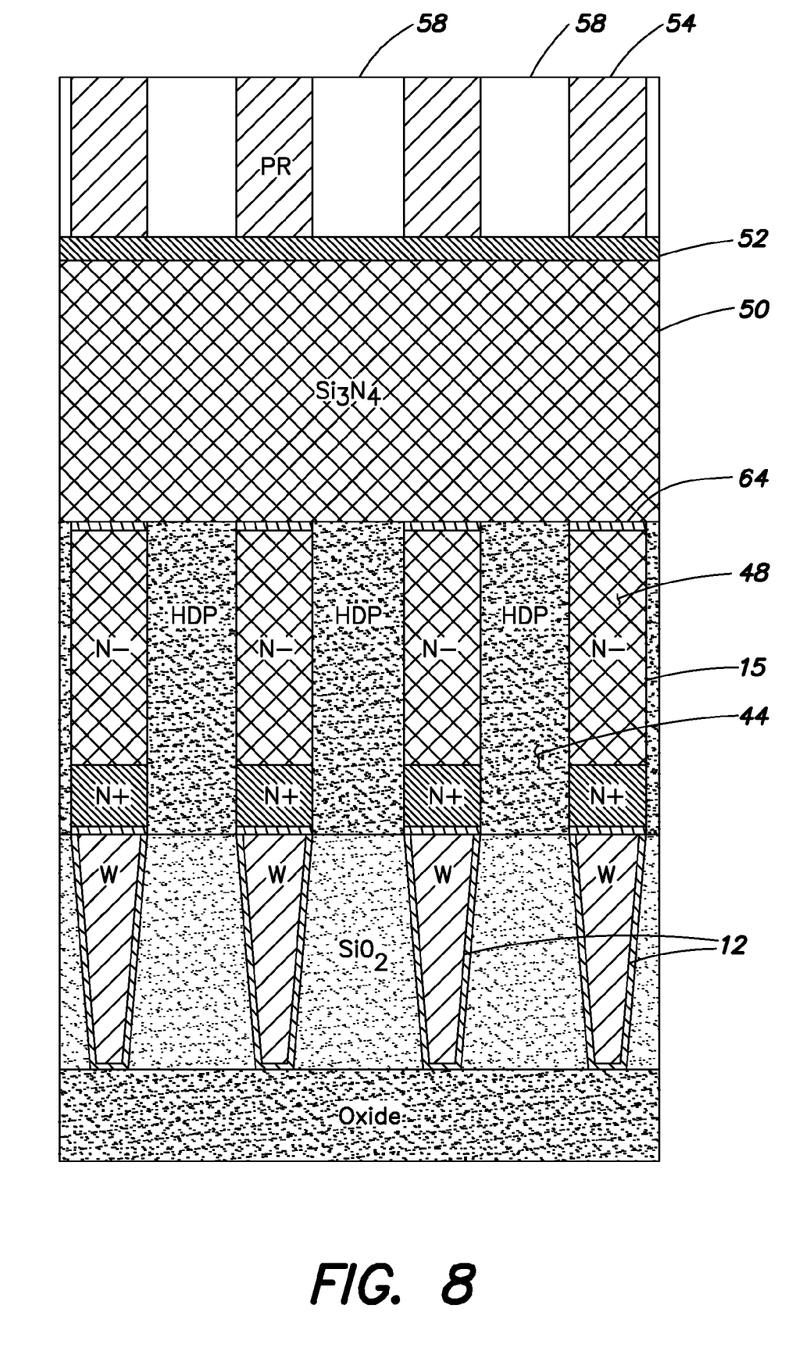
FIG. 8 is a cross-sectional view illustrating one embodiment of formation of a dielectric layer for the fabrication of the memory array.

Following planarization of the partially completed array another layer 50 of sacrificial material such as a dielectric material may be deposited over the lightly doped semiconductor 48 and insulating material 44 as shown in FIG. 8 using any known method of deposition. The sacrificial material may be any suitable material, and for example, as illustrated, may be silicon nitride. Sacrificial material layer 50 may be deposited over a native oxide layer 64 which may be allowed to grow over the lightly doped semiconductor 48.

The thickness of sacrificial 50 may be determined largely by a desired thickness of the next layer of conductor for the memory. In one embodiment the thickness is approximately 3000 angstroms. Sacrificial layer 50 may be covered with a hard mask 52 (e.g., DARC, BARC, etc.) as shown in FIG. 8 and by the photoresist layer 54.

Photoresist layer 54 may then be patterned as shown by exposing it through a photomask (not shown) to define areas of removed photoresist 58. It should be noted that the figures illustrate lines 58 as if they are perpendicular to the page in order to illustrate that there are multiple parallel lines. However, in actual construction they would be parallel to the page and perpendicular to conductors 12 at the bottom of structure 10.

Figure 9:
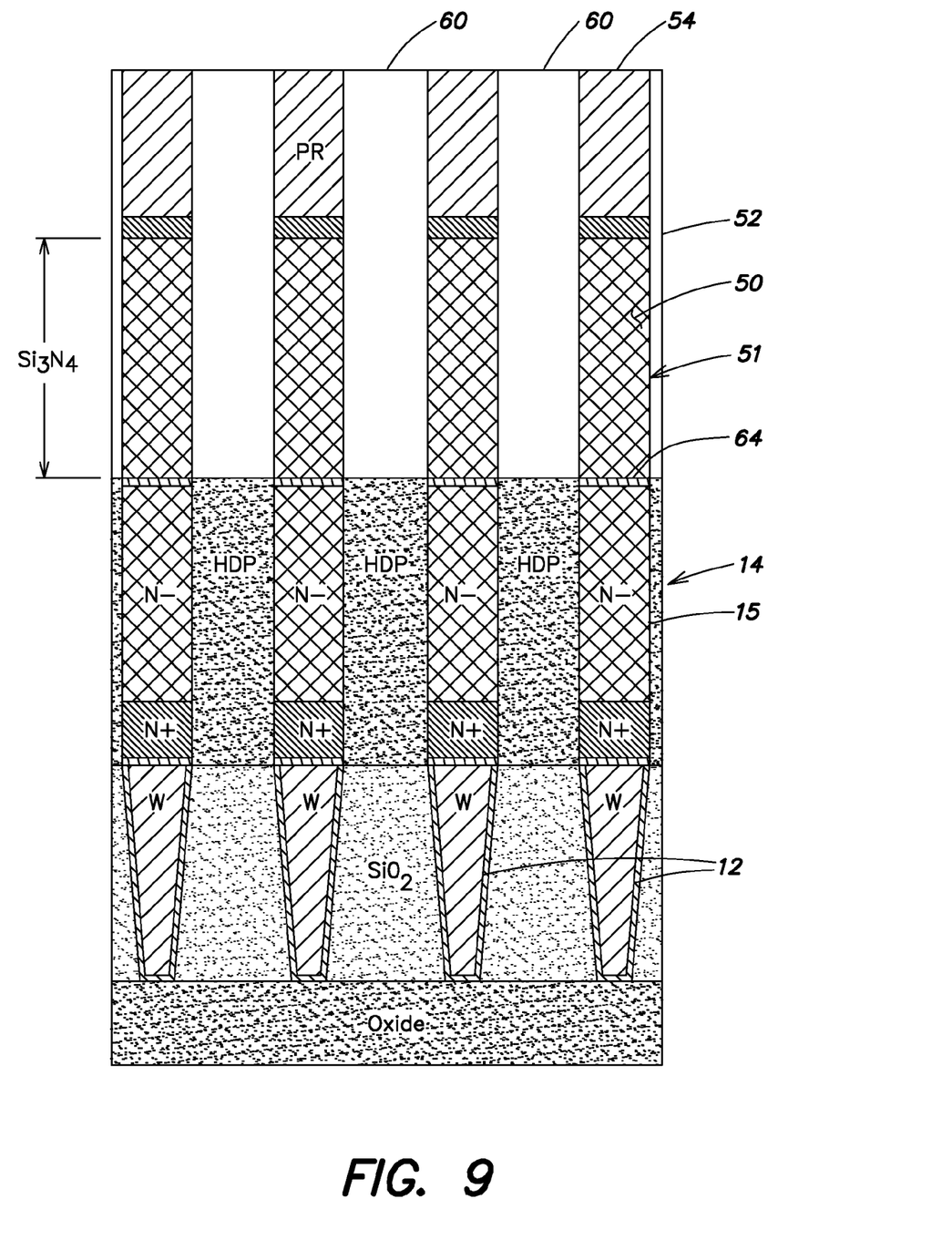
FIG. 9 is a cross-sectional view illustrating one embodiment of the formation of dielectric rails for fabrication of conductor lines for the memory array.

After photoresist layer 54 is patterned, an etch may be performed to remove hard mask layer 52 and sacrificial material 50 in the regions 58 where photoresist 54 was removed, forming etched areas 60 and rails of sacrificial material 51 as shown in FIG. 9. The etch may use any suitable process (e.g., a dry etch) for etching hard mark 32 and sacrificial material 50. After the etch, photoresist 54 as striped and the surface may be cleaned using, for example, an HF clean to remove any remaining photoresist.

Figure 10:
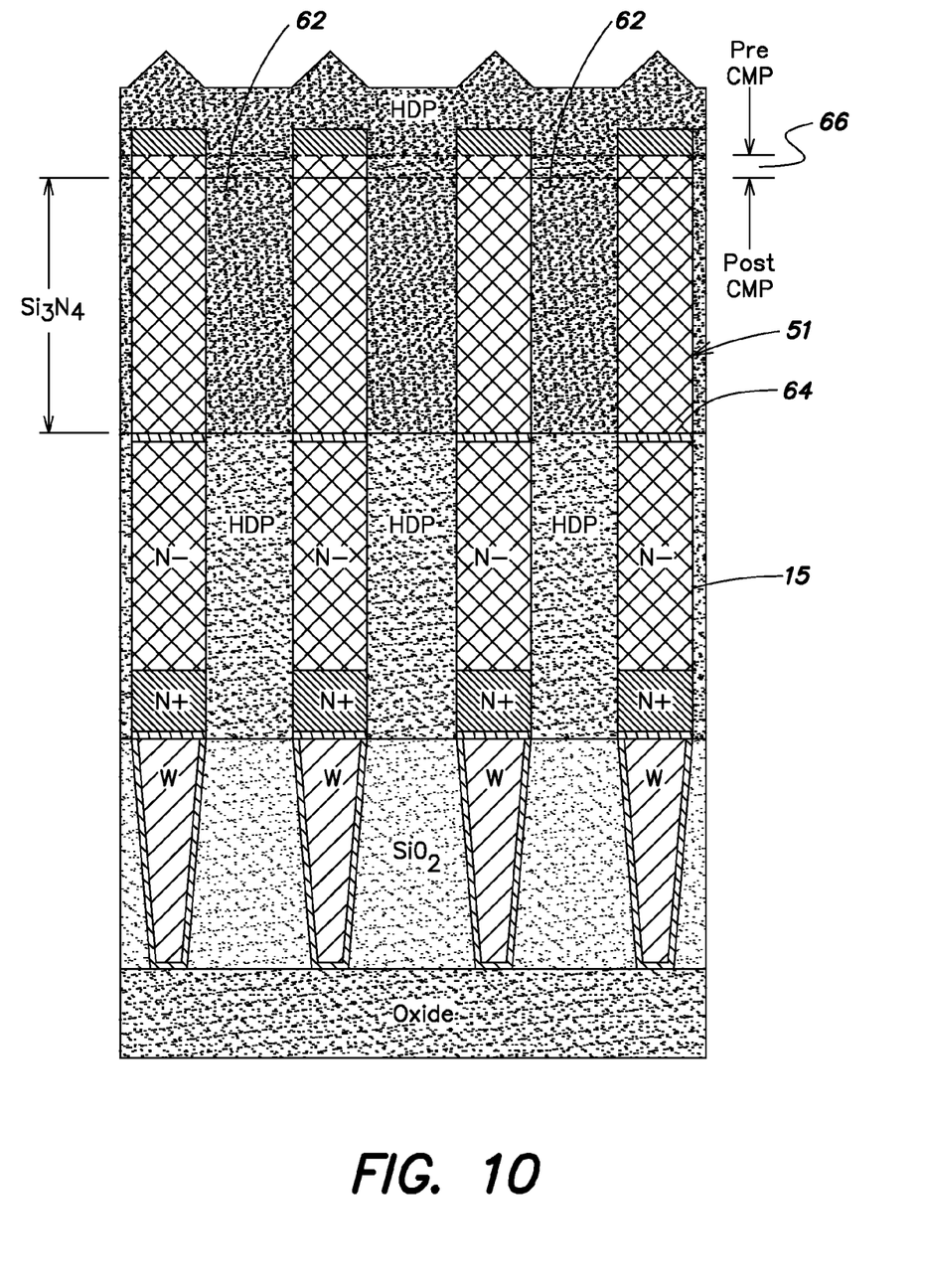
FIG. 10 is a cross-sectional view illustrating one embodiment of the deposition of insulating material over the dielectric rails for fabrication of conductors for the memory array.

After photoresist 54 is removed, etched areas 60 between rails 51 may be filled using any suitable insulating material 62 such as HDP oxide, as illustrated in FIG. 10. Excess of the insulating material 62 may be removed and the surface planarized by any suitable planarizing process such as CMP, which may be followed by a post-CMP clean step. This CMP processes may also remove a small portion 66 of the dielectric pillar portions 51, as shown.

Figure 11:
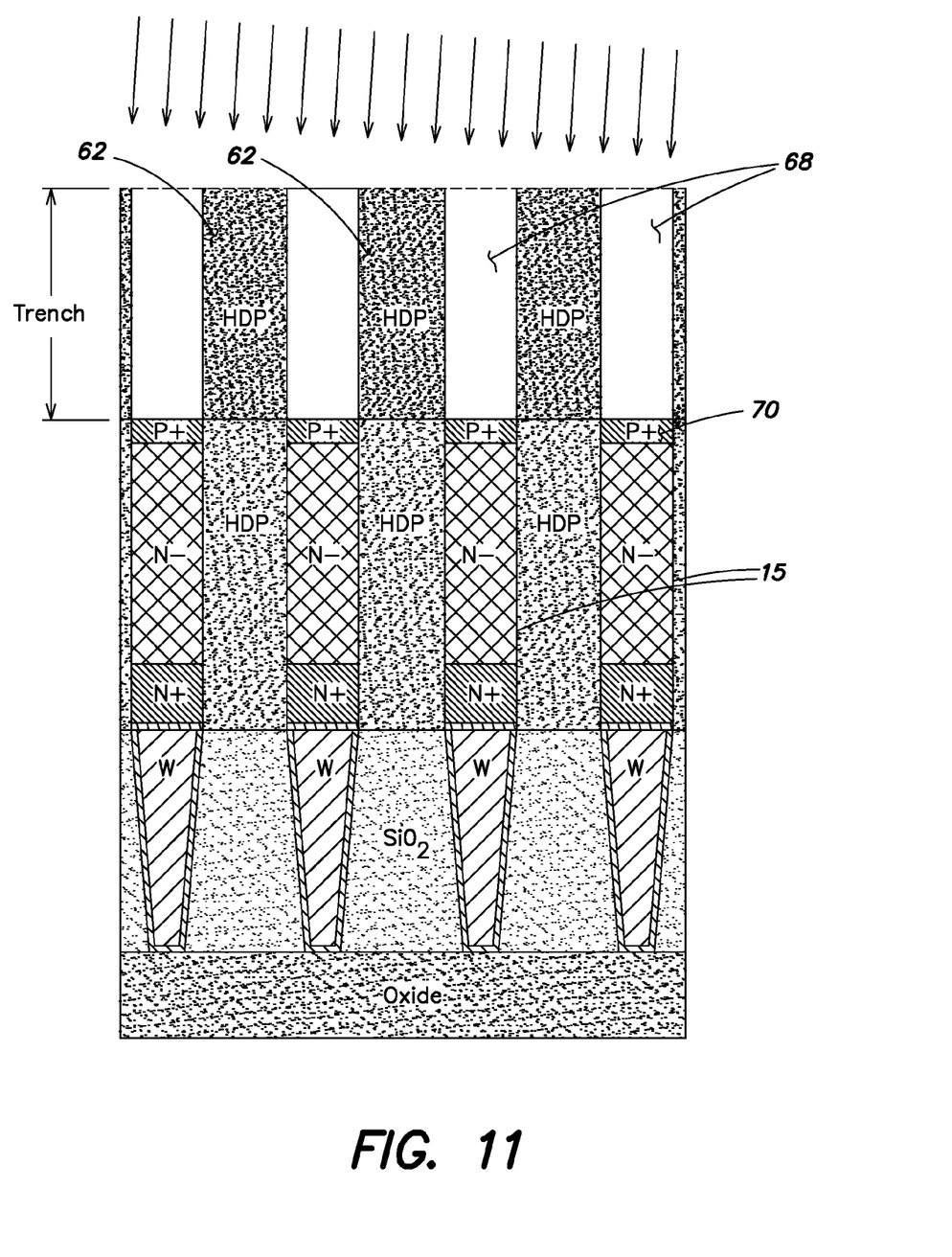
FIG. 11 is a cross-sectional view illustrating one embodiment of the fabrication of conductor trenches and ion implementation for fabrication of the memory array.

As illustrated in FIG. 11, the sacrificial rail 51 may be removed to create a mold of dielectric material 62 having trenches or slots 68 for forming conductors positioned over the lightly doped semiconductor pillars. In one embodiment using silicon nitride for the dielectric pillar portion 51 as illustrated in FIG. 10, this removal step may use an initial HF etch, followed by a wet etch of the silicon nitride leaving trenches aligned over the pillar memory elements 14.

Figure 13:
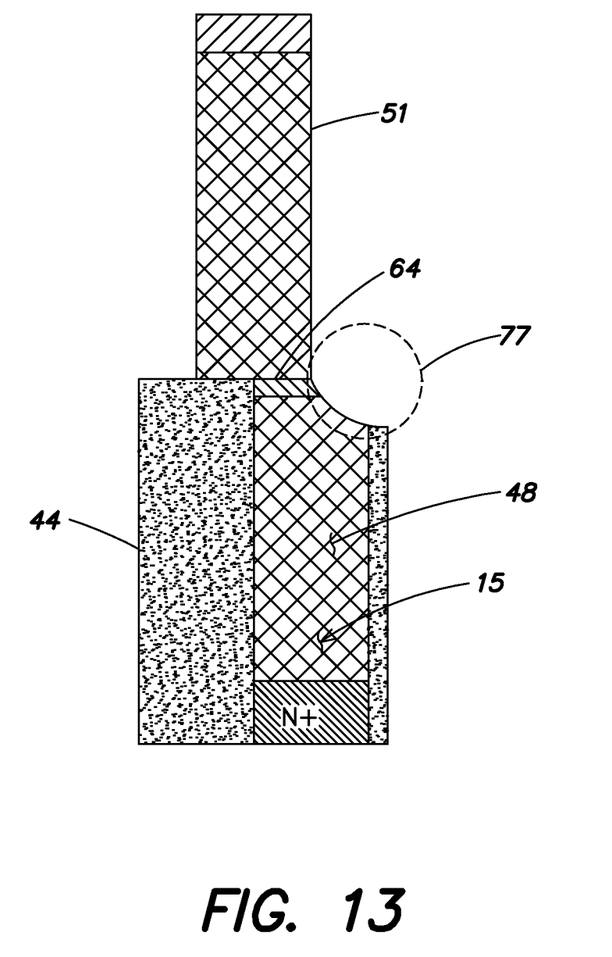
FIG. 13 is a cross-sectional view illustrating misalignment of the rails 51 over the pillar element 15.

A significant advantage of this method of forming the conductor mold over the pillar elements 14 is to reduce sensitivity to a misalignment. For example, in the illustrated embodiment of FIGS. 9 and 10 using silicon nitride for the sacrificial material 50, when the silicon nitride is etched, some misalignment 77, as shown in FIG. 13, of the mask will occur between the position of the sacrificial rails 51 and the pillar memory elements 15.

However, because the wet etch of the silicon nitride is highly selective over silicon dioxide, the native oxide 64 protects the underlying semiconductor material 48 of the pillar memory elements 15. Further, due to the unique process, even if the nitride etch cuts into the semiconductor material 48 of the pillar memory elements 15 in the misalignment region 77, the subsequent oxide filling step will fill the damaged area. Thus, alignment sensitivity is dramatically reduced allowing smaller feature size and higher yield.

Referring again to FIG. 11, the dielectric etch may be followed by an ion implementation process to create a highly doped region 70 at the top of the memory pillar elements 14, as shown. The ion implementation may be performed using any suitable ion implantation technology.

In one embodiment, the ion implantation may use the known technique of rotating the beam at an angle off of vertical as illustrated in FIG. 11. For example, in the illustrated embodiment, a p-type region 70 may be created by implementing boron ions (e.g., using $BF_2$, $B_{11}$, etc.) to form a peak concentration at a depth of about 500 angstrom, and using a rotating angle of about 7° off of vertical. In another embodiment, the ion beam may be at a 0° angle (i.e., vertical). After the implantation step, the surface of the implanted region may then be cleaned with an HF dip which may remove any native oxide (e.g., HF at 100:1 for 30 secs.).

The memory pillar elements 15 each form a diode and may also include an anti-fuse. In the illustrated embodiment, the pillar element is formed with highly-doped N+ type region 34 on the bottom and a highly doped P+ type region 70 on the top. Other embodiments may use various combinations of N+, N−, P+ and P− regions such as P+ for the bottom 34 and N+ top region 70. In addition, an anti-fuse may also be formed as part of the pillar memory element 15.

Figure 12:
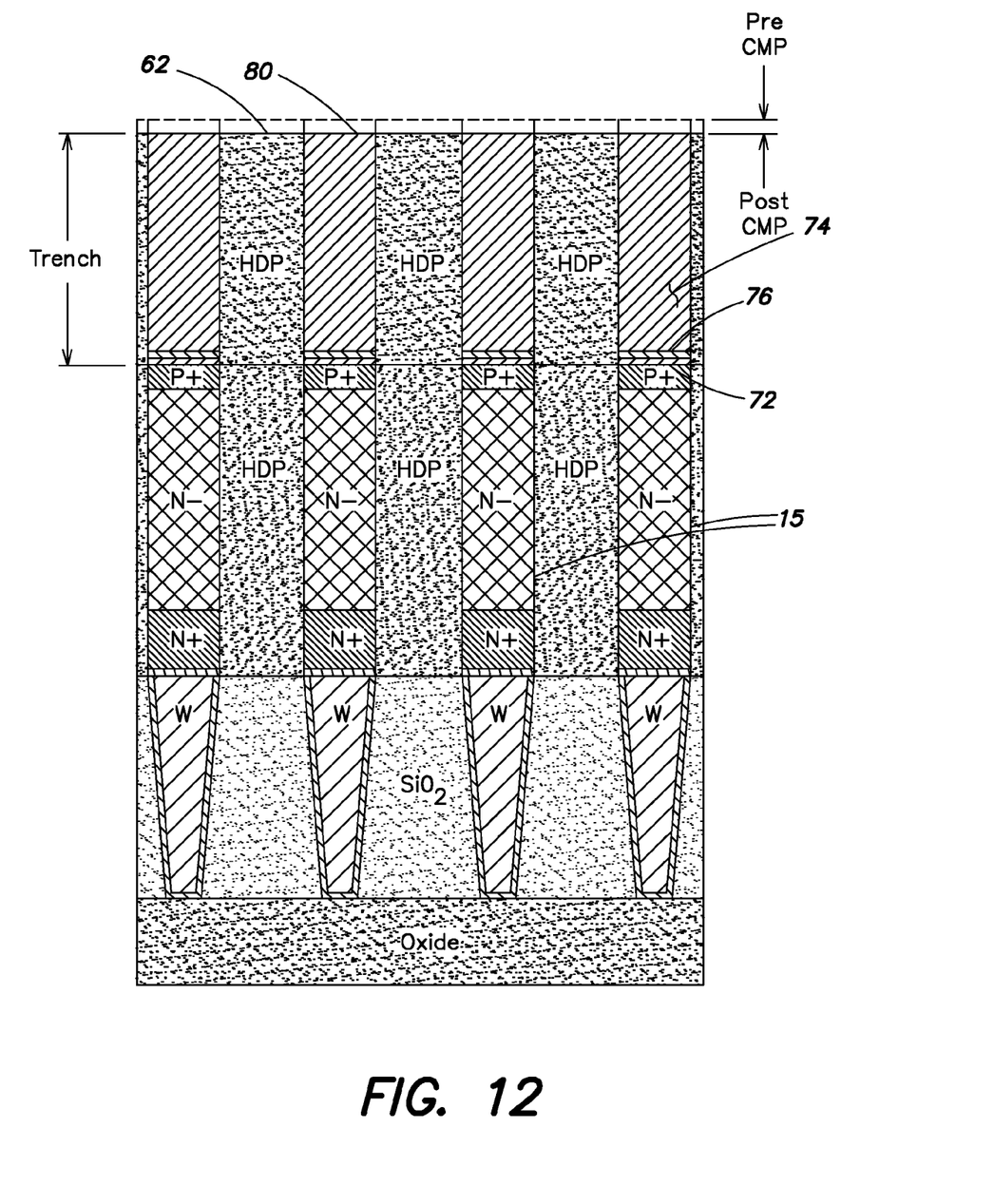
FIG. 12 is a cross-sectional view illustrating one embodiment of the formation of conductor lines for the memory array.

Thus, in the illustrated embodiment of FIG. 12, after the ion implantation and HF dip, an anti-fuse 72 may be grown using any suitable oxide formation process, for example, by oxidizing the underlying silicon in $O_2$ plus $N_2$ at a temperature of 650° C. for about 60 seconds. Thickness of this oxide may range from about 10 to about 100 angstroms, and in one embodiment may be about 17 to 22 angstroms.

After the antifuse is formed, the trenches 68 may be filled with a conductive material to form conductors 74 by depositing the conductive material as illustrated in FIG. 12. To improve adhesion of the conductor to the anti-fuse layer 72 an adhesion layer 76 may first be deposited in the trenches 68. The adhesion layer 76 may be any suitable adhesion material such as TaN, WN, TiW, TiN, etc.

In one embodiment, the conductor material of the conductor 74 may be tungsten with a thickness of about 2000-4000 angstroms and the adhesion layer may be TiN with a thickness of about 50-200 angstroms. After the conductive material has been deposited, the excess is removed and the surface planarized using any suitable planarizing process such as CMP. The planarizing process may remove a portion of the top of the conductor 74 and dielectric 62 while providing a planar surface 80 for further processing.

The resulting structure of FIG. 12 (also FIG. 1) is the memory array 10 made up of a plurality of memory elements 14 and conductors 12 and 16. Additional levels of the memory array of the same structure may be formed on the planarized surface 80 using the above described method.

The invention is not limited to the particular details of the example of method depicted, and other modification and applications are contemplated. Certain other changes may be made in the above-identified method without departing from the true spirit and scope of the invention herein involved. For example, although the invention is depicted with reference to non-volatile memory, the method and apparatus of the present invention can be utilized with a variety of memory systems. It is intended, therefore that the subject matter in the above description shall be interpreted as illustrative.

What is claimed is:

1. A method of forming a memory cell, the method comprising:
    forming a first opening self-aligned with a first pillar-shaped element that comprises a first semiconductor material; and
    depositing a second semiconductor material in the first opening to form a second pillar-shaped element above the first pillar-shaped element.

2. The method of claim 1, wherein the first semiconductor material comprises N-type semiconductor material, and the second semiconductor material comprises P-type semiconductor material.

3. The method of claim 1, wherein the first semiconductor material comprises P-type semiconductor material, and the second semiconductor material comprises N-type semiconductor material.

4. The method of claim 1, further comprising forming a second opening self-aligned with the second pillar shaped element.

5. The method of claim 4, further comprising filling the second opening with conductive material to form a conductor.

6. The method of claim 4, further comprising filling the second opening with a third semiconductor material.

7. The method of claim 6, wherein the first semiconductor material comprises a heavily-doped N-type semiconductor material, the second semiconductor material comprises a lightly-doped N-type semiconductor material and the third semiconductor material comprises a heavily doped P-type semiconductor material.

8. The method of claim 6, wherein the first semiconductor material comprises a heavily-doped P-type semiconductor material, the second semiconductor material comprises a lightly-doped N-type semiconductor material and the third semiconductor material comprises a heavily doped N-type semiconductor material.

9. A memory cell formed according to the method of claim 1.

10. A three-dimensional array of memory cells formed according to the method of claim 1.

11. A method of forming a memory cell, the method comprising:
- depositing a sacrificial material over a first semiconductor material;
- patterning and etching the sacrificial material to form first pillar shaped elements;
- depositing an insulating material between the first pillar shaped elements;
- removing the sacrificial material to form a mold having open areas between the insulating material; and
- depositing a second semiconductor material or a conductive material in the open areas.

12. The method of claim 11, further comprising after the removing of the sacrificial material:
- doping a portion of the first semiconductor material to form a highly doped region.

13. The method of claim 11, wherein the sacrificial material comprises a dielectric material.

14. The method of claim 11, wherein the sacrificial material comprises Si3N4.

15. The method of claim 11, wherein the insulating material comprises one or more of silicon oxide, silicon dioxide, silicon oxynitride, or a high density plasma oxide.

16. The method of claim 11, wherein the first semiconductor material comprises a heavily-doped N-type semiconductor material and the second semiconductor material comprises a lightly-doped N-type semiconductor material.

17. The method of claim 11, wherein the first semiconductor material comprises a heavily doped P-type semiconductor material.

18. A memory cell formed according to the method of claim 11.

19. A three-dimensional array of memory cells formed according to the method of claim 11.

20. A method of forming a memory cell, the method comprising:
- depositing a first sacrificial material over a first semiconductor material;
- patterning and etching the first sacrificial material to form first pillar shaped elements;
- depositing a first insulating material between the first pillar shaped elements;
- removing the first sacrificial material to form a first mold having first open areas between the first insulating material;
- depositing a second semiconductor material in the first open areas;
- depositing a second sacrificial material over the second semiconductor material;
- patterning and etching the second sacrificial material to form second pillar shaped elements;
- depositing a second insulating material between the second pillar shaped elements;
- removing the second sacrificial material to form a second mold having second open areas between the second insulating material;
- doping a portion of the second semiconductor material to form a third semiconductor layer; and
- depositing a conductive material in the second open areas.

* * * * *